US008640579B2

(12) United States Patent
Pedercini et al.

(10) Patent No.: US 8,640,579 B2
(45) Date of Patent: Feb. 4, 2014

(54) FEEDING APPARATUS AND METHOD

(75) Inventors: Maurizio Pedercini, Marmirolo (IT);
Damiano Fabbri, San Giorgio di Mantova (IT)

(73) Assignee: Sacmi Verona S.p.A. (IT)

( * ) Notice: Subject to any disclaimer, the term of this patent is extended or adjusted under 35 U.S.C. 154(b) by 256 days.

(21) Appl. No.: 13/255,335

(22) PCT Filed: Mar. 5, 2010

(86) PCT No.: PCT/IB2010/050953
§ 371 (c)(1),
(2), (4) Date: Nov. 14, 2011

(87) PCT Pub. No.: WO2010/103441
PCT Pub. Date: Sep. 16, 2010

(65) Prior Publication Data
US 2012/0055297 A1   Mar. 8, 2012

(30) Foreign Application Priority Data
Mar. 9, 2009  (IT) .............................. MO2009A0050

(51) Int. Cl.
*B26D 5/20* (2006.01)
(52) U.S. Cl.
USPC ............................................... 83/13; 83/209
(58) Field of Classification Search
USPC ............................... 83/13, 209, 210, 370, 364
See application file for complete search history.

(56) References Cited

U.S. PATENT DOCUMENTS

| 4,236,955 | A | * | 12/1980 | Prittie | 156/353 |
| 5,017,257 | A | * | 5/1991 | Murphy | 156/268 |
| 5,373,762 | A | * | 12/1994 | Kato | 83/42 |
| 5,735,785 | A | * | 4/1998 | Lucas et al. | 493/34 |
| 5,985,441 | A | * | 11/1999 | Szczepaniec et al. | 428/354 |
| 6,269,720 | B1 | * | 8/2001 | Pelagatti | 83/343 |
| 6,358,191 | B1 | * | 3/2002 | Greever | 493/34 |
| 7,024,841 | B2 | * | 4/2006 | Kramer et al. | 53/585 |
| 7,661,344 | B2 | * | 2/2010 | Beaudry | 83/76 |
| 7,987,755 | B2 | * | 8/2011 | Van Heck et al. | 83/286 |
| 8,056,455 | B2 | * | 11/2011 | Beaudry | 83/13 |
| 2009/0093974 | A1 | * | 4/2009 | Glass et al. | 702/34 |

FOREIGN PATENT DOCUMENTS

| EP | 1593604 A1 | 11/2005 |
| EP | 1652806 A1 | 5/2006 |
| WO | 0176833 A1 | 10/2001 |
| WO | 2006061775 A2 | 6/2006 |
| WO | 2007110738 A1 | 10/2007 |
| WO | 2007126347 A1 | 11/2007 |

* cited by examiner

*Primary Examiner* — Sean Michalski
(74) *Attorney, Agent, or Firm* — Laubscher & Laubscher, P.C.

(57) ABSTRACT

An apparatus (1) and a method for feeding a continuous tape (3) for forming labels (2) is disclosed, according to which a pair of rollers (5) advances the tape at an advancing speed that is calculated on the basis of the rotation speed of one cutting roller (6) that cuts the tape into labels, (2) at a signal that is indicative of the cut that occurred and at a positioning error of an actual image present on the tape with respect to a reference image. The real image is detected by a linear camera (9) or by a matrix camera.

10 Claims, 3 Drawing Sheets

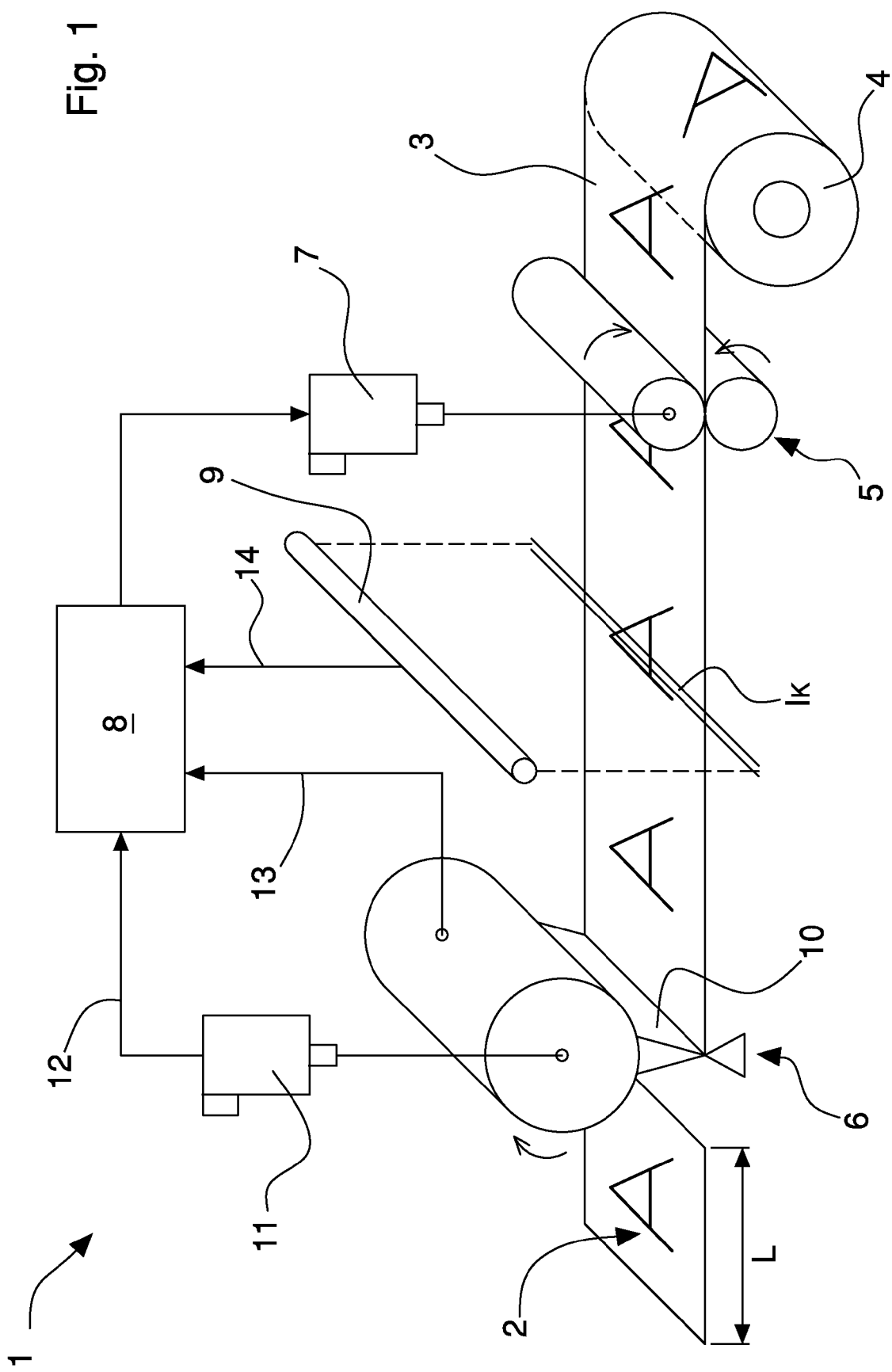

$$I_{TOT} = I_1 + I_2 + \ldots + I_K + \ldots + I_N$$

FEEDING APPARATUS AND METHOD

This application is a national phase of PCT International Application No. PCT/M2010/050953 filed Mar. 5, 2010. PCT/IB2010/050953 claims priority to IT Application No. MO2009A000050 filed Mar. 9, 2009. The entire contents of these applications are incorporated herein by reference.

BACKGROUND TO THE INVENTION

The invention relates to an apparatus and a method for supplying a continuous tape.

Specifically, but not exclusively, the invention can be used in the context of an apparatus for forming labels from a continuous tape (generally unwound from a reel) that has, distributed along the length thereof, a series of images that are preprinted and spaced apart from one another by a preset space (pitch) and will form the images on the labels.

As known, this pitch can be variable from one reel to another according to requirements, or even, can vary in the context of the same reel, sometimes also because of printing or unwinding errors.

A problem with known printing apparatuses is thus that of forming some labels from a continuous tape bearing the images, in which each image is centred on the label, whatever the pitch of the images distributed along the tape, even in the event of printing or unwinding errors that may have modified the nominal pitch of the images and/or may have distorted the images with respect to the desired distribution.

In order to overcome this problem, from WO 2006/061775 a continuous tape feeding apparatus is known in which a feeding device advances a tape along a path, a sensor detects an image on the advancing tape, a cutting device cuts the tape transversely into labels and a controller compares the detected image with a reference image and then adjusts the advancing speed of the tape on the basis of the aforesaid comparison in order to cut the tape in the correct position to form labels with a perfectly centred image.

The sensor used in the apparatus disclosed in WO 2006/061775 for detecting the image is a pixel optical sensor, or a band optical sensor that emits a signal indicative of the average value that a given optical feature assumes (for example luminous intensity) in a preset portion of the surface of the tape. Various aspects of the apparatus shown by WO 2006/061775 are improvable.

In the first place it would be advantageous to eliminate or minimise the risk of errors in the forming of the label that are due to a programmed or not programmed or also undesired variation in the operating parameters of the cutting device in the course of advancing of the continuous tape.

In the second place it would be desirable to improve the precision and reliability of the known apparatus, for example by reducing the negative effects due to possible transverse movements of the tape in relation to the advancing direction thereof, effects which may compromise the correct operation of the apparatus in WO 2006/061775. It has been observed that in WO 2006/061775 the use of the band sensor, that on the one hand can help reduce to a certain extent the imprecision due to undesired transverse movements of the tape and on the other hand is imprecise through the nature thereof.

It would be further desirable to improve efficacy in monitoring the print quality of the image in the tape and/or in recognising malfunctions of the feeding apparatus (for example errors in mounting the reel and/or the tape) and/or in identifying the size of the tape and of the corresponding label.

SUMMARY OF THE INVENTION

An object of the invention is to improve one or more of the aspects mentioned above of the apparatuses for feeding tapes for labels, in particular the apparatus shown by WO 2006/061775.

Another object is to provide a method for feeding tapes for labels on the basis of which being able to monitor effectively a feeding apparatus.

Still another object is to make an apparatus and/or a method for feeding a tape for labels that is able to adapt rapidly and precisely to any possible change (expected or unexpected) in the operating situation of the labelling apparatus that applies the labels to objects.

An advantage of the invention is to eliminate or minimise the risk of errors in the formation of the label that are due to undesired transverse movements of the tape.

Another advantage consists of providing an apparatus and/or a method owing to which it is possible to perform, with great precision and reliability, monitoring, and possibly feedback control by using a tape aligning device of known type for aligning the position of the tape in a transverse direction (alignment).

A further advantage is to make an apparatus and/or a method available that enables labelling quality to be controlled effectively, in particular in terms of detecting the print quality of the images on the tape, identifying the size of the tape coupled with the feeding device, checking that the label being processed corresponds to the label it is desired to produce (desired label corresponding to a stored reference image), recognising the correct coupling of the tape with the feeding device, etc, etc.

One or more of such purposes and advantages and still others are achieved by the apparatus and method according to one or more of the claims set out below.

SHORT DESCRIPTION OF THE DRAWINGS

The invention can be better understood and implemented with reference to the attached drawings that illustrate some embodiments thereof by way of non-limiting examples.

FIG. 1 shows a diagram of an example of the apparatus made according to the present invention.

DETAILED DESCRIPTION

Figure 3:
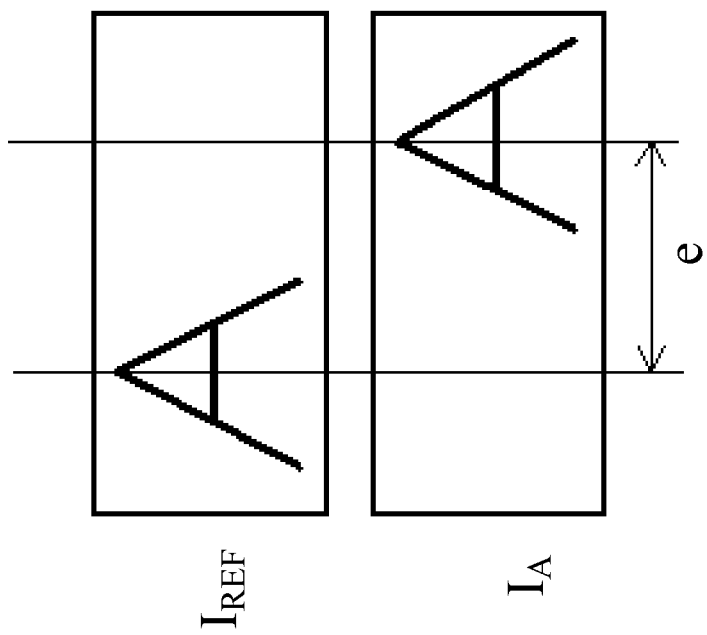
FIG. 3 is a diagram illustrating a possible manner of comparing a detected image with a stored reference image.

With reference to the aforesaid figures, with 1 an apparatus has been overall indicated that provides labels to a labelling apparatus (known and not illustrated), with 2 a label provided by the apparatus 1 to an outlet end of the apparatus is shown, the outlet end being connected to the labelling apparatus, with 3 a continuous tape is indicated that displays the images that will form the labels (in the example the images of the labels have been represented for the sake of simplicity by way of example with a series of "A"), with 4 a reel is indicated from which the tape 3 is unwound, with 5 a feeding device is indicated that supplies the continuous tape 3 along a path in an advancing direction, with 6 a cutting device is indicated that cuts the tape 3 that advances along the path with a cutting line that is transverse to the advancing direction. The apparatus may further comprise an aligning device that is known and not illustrated that is configured for regulating the transverse position of the tape, i.e. the alignment with respect to an advancing axis or longitudinal axis of the tape.

The feeding device 5 may include any type of advancing system of a continuous tape. The advancing system may operate continuously or intermittently. In the preferred embodiment, the feeding device 5 optionally includes at least one pair of counter-rotating conveying rollers through which the tape passes with a dragging effect. The feeding device 5 is provided with a driving device optionally including at least one motor 7. In the embodiment, at least one of the two conveying rollers is rotated by the motor 7, which is controlled by a control and command system 8 (including, for example, one or more known controllers/computers of known type, PLC, PC, Inverter, etc.) to which appropriate command instructions are sent, as will be explained better further below in this description.

The cutting device 6 may comprise any known type of system that is suitable for transverse cutting (for example perpendicular to the advancing direction of the tape and/or to the longitudinal extent thereof) of a continuous advancing tape (continuously or intermittently) to form a series of discrete elements (labels 2) of a preset length L. The cutting device 6 optionally comprises at least one cutting roller provided with at least one blade 10 (with a cutting line transverse to the tape and parallel to the rotation axis of the roller) that cyclically, with an operating period that depends on the rotation speed of the cutting roller, transversely cuts a piece of tape. The blade 10 operates in general in cooperation with a contrasting element (for example a fixed counter-blade or counter-blade carried by a further counter-rotating roller in a synchronised manner). The cutting device 6 could comprise two or more blades, which are, for example, arranged on the rotating supporting roller and are angularly (equi)distant from one another. The cutting device could comprise a device of non-mechanical type, such as, for example, a cutting/engraving device of laser type, for example like the one disclosed in patent WO 2007/110738.

The cutting device 6 is provided with a driving device optionally including at least a motor 11, as in the illustrated example, or a system (for example mechanical) for connecting with other moving mechanical members of the labelling apparatus (as for example the rotating conveying carousel), in which case it is possible to set up a position or movement sensor connected to the system (for example, an absolute or relative encoder or a resolver), which sensor can be used optionally to control the cutting operation. As in the preferred embodiment disclosed here, at least one cutting roller can be rotated by the motor 11, which is controlled by a control and command system (which is known and not illustrated) which could be distinct from (or be integrated into) the controlling system 8 for controlling the advancing of the tape 3 and which controls the cutting device 6 on the basis of setting values that are optionally preselected in function of the operating requirements and/or mode of a labelling apparatus (which is known and not illustrated) arranged below the cutting device 6.

The apparatus 1 includes a system of various sensors connected to the controlling system 8 for controlling the apparatus. In particular, the apparatus includes a first sensor 9 for detecting an image on the tape 3, as will be explained more fully further on in the description. The apparatus 1 includes a second sensor, which is known and not illustrated, that may include a single sensor or a group of sensors or a set of sensor devices. The second sensor is configured for emitting at least a second signal 13 that is indicative of the moment in which the cutting device 6 assumes a certain operating configuration. The second sensor may optionally include an encoder (which is known and not illustrated) that is operationally associated with the cutting roller and configured for emitting a determined signal (for example a zero position signal) at a preset position of the roller (as for example, the position that corresponds to the moment of execution of the cut of the tape). The control and command system 8 is configured for recognizing the aforementioned determined signal (second signal 13) and for consequently defining the moment in which a given operation occurs and/or in which the cutting device 6 assume a certain operating configuration.

The apparatus includes a third sensor (a single sensor or a group of sensors or a set of sensor devices) configured for emitting at least a third signal 12 indicative of an operating parameter of the cutting device. The third signal 12 indicates an operating parameter of the cutting device 6 that is optionally a function parameter of time or parameter that is variable during operation of the cutting device. This parameter may be the operating speed of the cutting device 6 (for example the rotation speed of the cutting roller that is detectable by a speed sensor of the type which is known and not illustrated) or another function parameter of the time or the position of a movable element of the cutting device 6 or another parameter that is variable during operation of the cutting device.

The second and the third sensors can be integrated into a single sensor (or group of sensors or set of sensor devices) that can perform both the aforementioned functions, such as, for example, an absolute encoder.

The control and command system 8 of the tape advancing device 3 is connected to the cutting device 6 so as to be able to receive the aforementioned third signal 12 indicative of an operating parameter of the cutting device 6 (in particular the speed of an operating element of the cutting device such as, for example, as already indicated, the rotation speed of the cutting roller). The control and command system 8 in particular could be connected to the cutting tool and/or to the driving device of the cutting device 6 and/or to the control and command system of the cutting device 6. The signal 12 could include, for example, a signal (for example the 'speed' signal) of an encoder or a resolver, for example, as in the specific case in which the cutting device 6 is not equipped with its own independent motor drive (comprising for example the motor 11), but is driven by a (mechanical) connecting system with other moving members (in which case the aforementioned encoder or resolver can be connected to this connecting system).

The control and command system 8 of the advance of the tape 3 is connected to the cutting device 6 such as to be able to receive the aforesaid second signal 13 that is indicative of the fact that the cutting device 6 has assumed a particular operating configuration (such as, for example the operating configuration that coincides with the moment of execution of the cut of the tape). If the cutting device 6 is provided with two (or more blades) 10, at each revolution of the cutting roller two (or more) second signals 13 will be generated. The second signal 13 could comprise a signal (for example the 'zero' trace) emitted by the aforesaid encoder or resolver that generates the signal 12 ('speed' signal), in particular in the case cited above in which the cutting device 6 is driven via a connecting system connected (mechanically) with other moving members.

As said, it is possible to use an absolute encoder (rather than a relative or incremental encoder), in which case the provided signal can be used both to detect a determined operating parameter of the cutting device and for determining when the device has assumed a particular operating configuration; in substance it is possible to use a single type of signal to obtain the indications disclosed above, which are provided by the two types of signal 12 and 13.

The apparatus 1 that provides labels 2 comprises, as said, the first sensor 9, which is configured for emitting and sending to the control and command system 8 a plurality of first signals 14 indicative of an image located on the tape 3 advancing along the supply path. The first sensor 9 comprises a plurality of photosensitive elements arranged spaced apart from one another in a direction that is transverse to the advancing direction of the tape. In particular, the photosensitive elements can be arranged aligned in a direction that is perpendicular to the advancing direction of the tape. The first sensor 9 may in particular comprise an image acquisition device in which the photosensitive elements are relatively numerous and are arranged for forming a line (for example a linear camera) arranged transversely (perpendicular) to the direction of longitudinal extent or advancing of the tape. The first sensor 9 may comprise a linear camera or other device configured for acquiring a line-by-line image.

The first sensor 9 may comprise, for example, a camera of matrix type (photosensitive elements arranged as a matrix or a grid) that acquires the image by square, in which the acquisition zone relates to at least all or almost all the width of the tape. In particular, the first sensor 9 could be configured for operating on an image acquisition zone that extends laterally beyond the width of the tape, i.e. beyond at least a side edge of the tape (beyond one of the two side edges of the tape or, as in the illustrated example in FIG. 1, beyond both the side edges of the tape).

The choice of the number and dimensions of the photosensitive elements depends, as is known in an image acquisition device, on a compromise between resolution and sensitivity that will in turn depend on the specific use parameters (tape width, type of image, etc). Also the choice of the type of sensitivity of the photosensitive element (colour, black and white, etc) and the sampling speed and other features that may distinguish the image acquisition device, will depend on the operating conditions of the feeding apparatus and is not discussed in greater detail.

The first sensor 9 comprises a plurality of photosensitive elements of pixel type, optionally arranged aligned along a line that is transverse to the advancing direction of the tape so as to analyse an image line arranged transversely on the tape.

The first sensor 9 is arranged before the cutting device 6 and can be arranged before the feeding device 5 or, as in the illustrated example, after this device.

Figure 2:
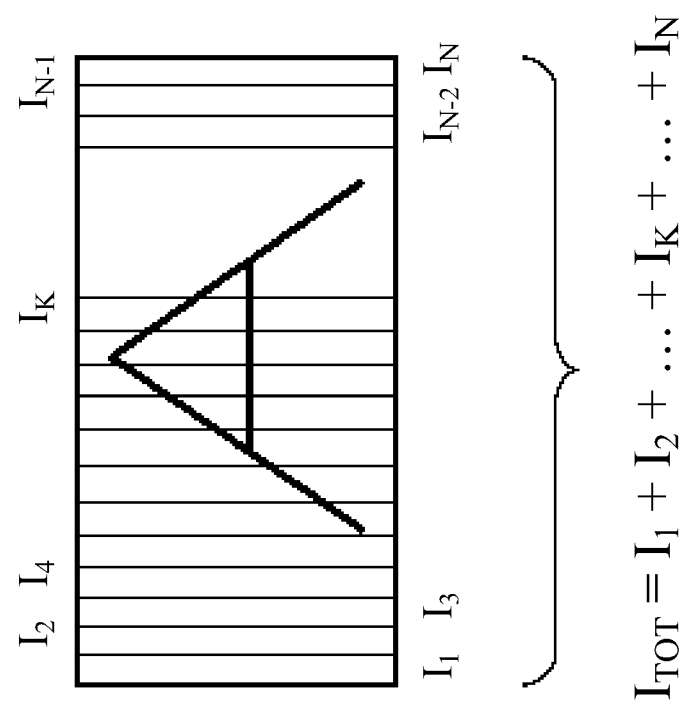
FIG. 2 is a diagram illustrating a possible manner of detecting the images on the moving continuous tape according to the present invention.
Figure 4:
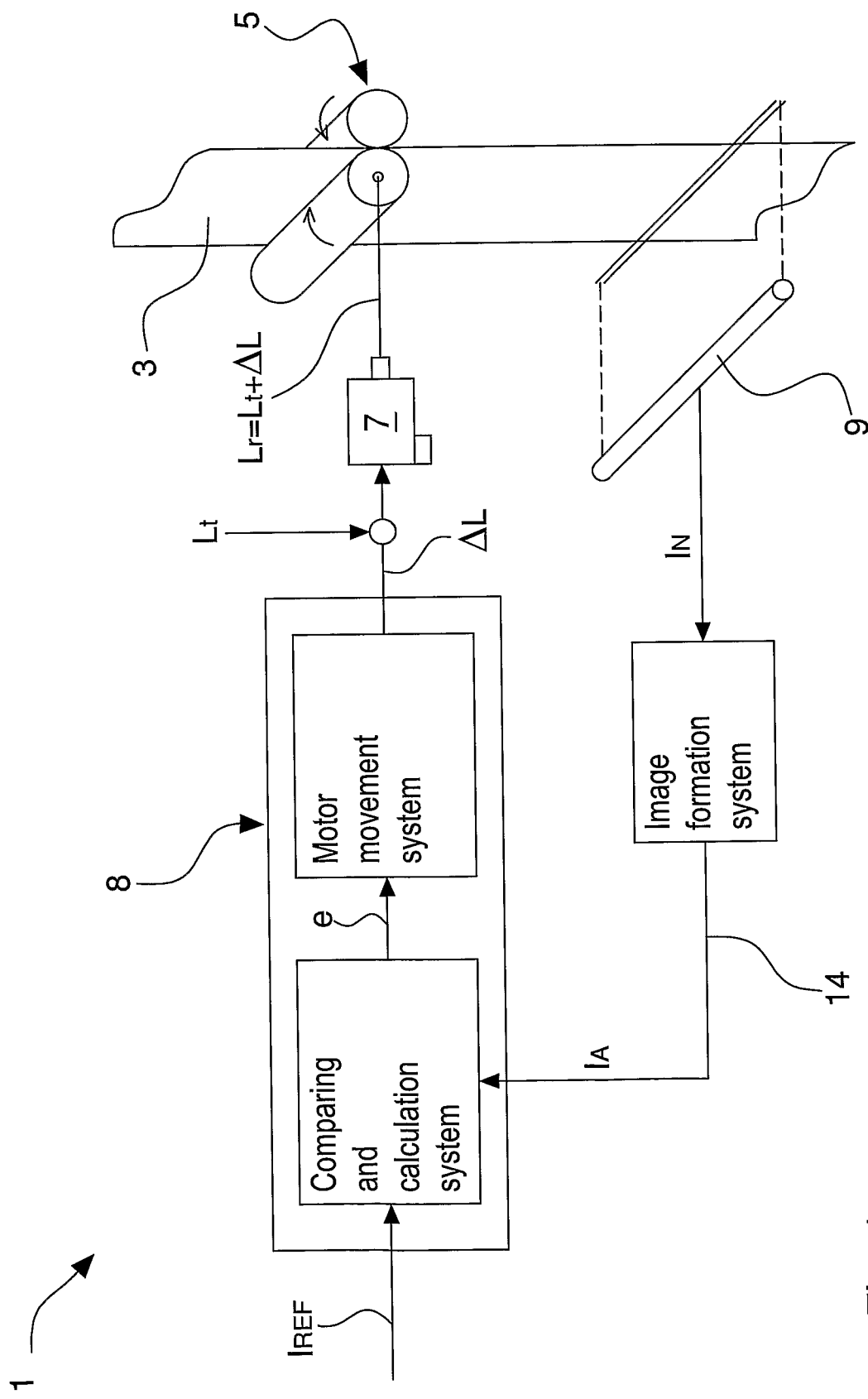
FIG. 4 is a possible control diagram for controlling the advance of the continuous tape displaying the images with which to form the labels.

It is possible to arrange, in an example that is not illustrated, one or more further first sensors (for example cameras of linear type) each arranged also transversely to the tape and spaced apart in the length of the tape with respect to the first sensor 9, to have a signal redundancy. In FIG. 2 there is illustrated schematically the mode for detecting the image made by the first sensor 9, that sends a series of single image lines I1, I2, . . . , IN, (with a preset acquisition frequency that could be linked to the operating speed of the cutting device 6) to the control and command system 8 that composes the image, reconstructing it, for example by plotting a composition (Itot=I1+I2+ . . . Ik+ . . . +IN as illustrated in FIG. 2) of the single detected image lines. Each image line will comprise a set of signals (signals vector) provided by the various sensitive elements that make up the sensor 9.

The control and command system 8 is configured for controlling the apparatus 1, making the apparatus 1 perform the operations disclosed below, the configuration of the system 8 being achievable, for example, via an instructions program (software) associated with the system 8. The control and command system 8 could be implemented in any of the known implementation modes of a general controller, such as, for example, by transmitting information (instructions) from a remote source, or by entering information (instructions) contained in a removable or fixed supporting device, etc.

The control and command system 8 can control the apparatus with the following operating cycle: the controlling system 8 receives the third signal 12 and on the basis of the third signal 12 determines the acquisition frequency of the first signal 14 and the advancing speed of the tape 3; then at the arrival of the second signal 13 it closes the image composition.

In particular the system 8 is configured for driving the feeding device 5 for feeding the continuous tape 3 along the preset path; the system 8 is further configured for receiving the first signals 14 to identify the image on the tape 3; the system 8 is further configured for selecting a group of first signals 14 in function of the moment indicated by the second signal 13. In substance, the control and command system 8 can group the image signals (first signals 14) to form a group that includes the signals that are carried between two moments identified by two (consecutive) second signals 13. The control and command system 8 is configured for comparing the group of first signals 14 thus defined (which represents the actual image Ia that passed in front of the first sensor between the emission of two consecutive second signals 13) with a stored group of reference signals Iref (see FIG. 3) and then controls the drive of the feeding device 5 (for example by adjusting the speed of at least one of the feeding rollers) on the basis of the aforesaid comparison and on the basis of the third signal 12.

In particular the comparing operations comprise the calculation of a length "e" (said phase error) determined by the difference (longitudinally) between the position of the reference image Iref and the position of the actual image Ia (as shown in FIG. 3), this difference "e" being in substance a position displacement considered with reference to the advancing direction of the tape. This length "e" thus represents a positioning error in the advancing direction that can be corrected by appropriate modification of the feed of tape 3 (for example by varying the rotation speed of the feeding roller). In the specific case the feeding device 5 is commanded to advance the tape by an amount equal to Lr=Lt+ΔL (where Lr is the real actually measured length of the label, Lt is the theoretical length of the label and ΔL is a correction length depending on the phase error "e" and is calculated on the basis of this error) in the period of time T that elapses between two (chronologically consecutive) cuts of the tape. The dependency between the correction length ΔL and the phase error "e" is a function of an algorithm that links ΔL and "e" and which may comprise, for example, a regulator of any type, in particular a PI regulator (as in the example of patent WO 2006/061775) or a PID regulator or a mathematical model that places ΔL and "e" in a relation.

The aforesaid period T, which can, for example, be the same as the time that the cutting roller takes to perform a complete revolution (if the cutting device has only one blade 10), is not necessarily constant but may depend, for example, on one or more operating parameters of the labelling apparatus (for example on the production speed of the apparatus).

It should be noted that the reference image Iref, which is used in the comparison operation for determining the positioning error or phase error "e" as seen previously, can be memorised according to an initial acquisition procedure (learning) that may comprise, for example, the initial learning procedure disclosed in WO 2006/061775 which is incorporated for reference. This initial acquisition procedure will be run, in general, only once for each image and/or label size used on the apparatus, in general at the first use of the size. This learning procedure may comprise, in brief, an operation of unwinding the tape 3 from the reel 4 (also manually) by a desired amount L (nominal length of label for a certain size) so as to enable the first sensor 9 to send the first signals 14 that will enable the controlling system 8 to compose the Iref reference image.

It is observed, for completeness, that to obtain correct centering of the label, whatever the Iref reference image acquired during the learning phase, it is possible to consider a further offset value, as has been disclosed in pages 17 and 18 of WO 2006/061775, which is incorporated here for reference.

A practical embodiment of how the control method of the apparatus 1 according to the invention could be implemented is disclosed below.

The cutting device 6 is set (in particular the speed of the cutting roller is set) taking account of the needs of the labelling apparatus (not illustrated) arranged downstream. For this purpose it is possible, for example (as already indicated), to arrange a mechanical connection between an operating element (for example, a conveying carousel of the objects to be labelled) of the labelling apparatus, or, alternatively, by setting the driving device (for example the motor 11) of the cutting device 6 so that the latter follows the aforementioned operating element (to a conveying carousel), for example by controlling the speed of the cutting device 6 with a setting value that is proportional to a (setting and/or measured) value of the aforementioned operating element (for example, the rotation speed of the conveying carousel).

If there is only one blade 10 on the cutting roller, at each complete revolution (360° revolution) of the cutting roller, the blade 10 will cut a label 2 from the (continuously) advancing tape 3.

The feeding device 5 is driven by the motor 7, which is controlled so that at each revolution of the cutting device 6, the feeding device 5 has wound a length Lr of tape, where Lr will be the actual length of print impressed on the tape that will define the length of the label.

Driving the feeding roller will produce the unwinding of a portion of length Lr of the tape 3 from the reel 4 in the time T that is equal to the period of a complete revolution of the cutting roller. The speed of the feeding roller will thus be determined by taking into account the speed of the cutting roller.

Thus at each complete rotation (one revolution) of the cutting roller, the feeding roller should unwind a certain length of tape 3 from the reel 4 and thus pass a portion of tape of the same length in front of the first sensor 9 (linear camera or matrix camera).

At each fraction of a revolution of the cutting roller, the first sensor 9 will detect a fraction (in particular at least one line if the first sensor 9 comprises a linear or matrix camera) of Ik image (see FIGS. 1 and 2).

The acquisition frequency of the first signal 14 will be optionally proportional to the operating speed of the cutting device 6 that is determined by the signal 12. During rotation of the cutting roller the first sensor 9 (linear or matrix camera) will acquire a multiplicity of image lines I1, I2, . . . , In, forming an Itot image consisting of the composition of the single image lines, i.e. Itot=I1+I2+ . . . +In. The image Itot will in effect consist of the control and command system that will comprise, for example, the same (electronic) processing unit with which the linear or matrix camera can be provided.

Further, at each complete revolution of the cutting roller, the cutting device 6 will provide a second signal 13 (cut performed signal) to the controlling system 8 that will associate this signal 13 with the sum of the signals of the image Itot. The controlling system 8 will thus store the image Itot reconstructed up to the moment of receipt of the signal 13 (until the cutting performed moment) and the image that is thus stored will be considered the real final image Ia that will be the object of the subsequent comparison. In substance, at each cut of the tape (i.e. in the specific case in which the cutting roller has a single blade 10, at each complete rotation of the cutting roller) the controlling system 8 defines and stores the actual image Ia that has actually passed in front of the first sensor 9 (linear or matrix camera).

This actual image Ia will then be compared by the controlling system 8 with the previously acquired Iref reference image and will thus determine the positioning error "e" that is equal to the distance (in the advancing direction of the tape 3) between Ia and Iref. The system 8 will then calculate the correction distance ΔL (ΔL being calculated in function of "e", for example by a PI or PID regulator), i.e. the length of tape that the feeding device 5 has to unwind, more or less, with respect to the (theoretical) nominal preset length Lt in the period of time T that passes between two consecutive cuts (cutting period).

In brief, the control and command system 8 is programmed so as to unwind from the reel 4 a length of tape 3 that is the same as Lt+ΔL in the period of time T (i.e. the cutting period, which can be variable and is determined each time, in real time, in function of the speed of the cutting roller send to the system 8 with the third signal 12).

The effect of the correction of the speed of the feeding roller will be to return the actual image Ia in phase with the Iref reference image so as to centre the image on the label 2.

The feeding apparatus can comprise, as said, an aligning device for tapes, of a type which is known and not illustrated, which regulates the position of the tape in transverse direction (in particular perpendicular) to the length of the tape, i.e. to align the tape that advances to position the tap in axis with a desired advancing line. The signals supplied by the first (optical) sensor 9, comprising for example a linear camera, can be used to perform feedback control of the alignment, in which case the control unit (system 8) acquires one or more of the single image lines Ik, to process the image line Ik acquired for determining the position of the image in a transverse direction (alignment), comparing said position of the image with a reference that indicates the correct alignment of the tape, and commanding the aligning device so as to correct a possible alignment error of the advancing tape.

The invention claimed is:
1. An apparatus comprising:
 a feeding device configured for feeding a continuous tape along a path in an advancing direction;
 a cutting device configured for cutting a tape that advances along said path with a cutting line transverse to said advancing direction;
 a first sensor configured for emitting a plurality of first signals indicative of an image located on a tape that advances along said path; and
 a controller configured for performing the following operations:
  driving said feeding device to feed a tape along said path;
  receiving said plurality of first signals and comparing at least a part of said first signals with stored reference signals; and
  controlling said driving on the basis of said comparison;

said first sensor comprising a plurality of sensitive elements spaced apart from one another in a direction that is transverse to said advancing direction, each of said sensitive elements being configured for emitting a signal that is indicative of a respective portion of said image, wherein said apparatus further comprises a third sensor configured for emitting at least a third signal indicative of an operating parameter of said cutting device, said operating parameter being a function of time or being variable during operation of said cutting device, said controller being configured for receiving said at least a third signal and for controlling said driving, not only on the basis of said comparison but also on the basis of said at least a third signal.

2. An apparatus according to claim 1, wherein said controller is configured for periodically receiving the signals emitted by said sensitive elements for acquiring a series of single transverse image portions and for comparing said series of single transverse image portions with a series of stored reference single transverse image portions.

3. An apparatus according to claim 1 or 2, wherein said first sensor comprises a linear camera arranged on said path transversely to said advancing direction.

4. An apparatus according to claim 1 or 2, wherein said first sensor comprises a matrix camera operationally arranged on said path.

5. An apparatus according to claim 1 or 2, and further comprising an aligning device for adjusting the position of the tape in a direction that is transverse to said advancing direction, said controller being configured for controlling said aligning device on the basis of said first signals.

6. An apparatus according to claim 1 or 2, and further comprising a second sensor configured for emitting at least a second signal indicative of the moment in which said cutting device assumes a given operating configuration, said controller being configured for selecting a group of said first signals as a function of said moment indicated by said at least a second signal and for comparing said group of said first signals with a stored group of reference signals.

7. An apparatus according to claim 1 or 2, wherein said comparing operation comprises processing said plurality of first signals to determine an actual image, processing said stored reference signals to determine a reference image, and determining a position error in said advancing direction between the position of said actual image and the position of said reference image; said operation of controlling said driving comprising controlling the advancing speed of said tape on the basis of an operating speed of said cutting device and of said position error.

8. An apparatus according to claim 6, wherein said second and said third sensor are integrated into a single sensor.

9. A method comprising the steps of:
   feeding a continuous tape along a path in an advancing direction, said tape having an image;
   cutting said tape that advances along said path with a cutting line transverse to said advancing direction;
   emitting a plurality of first signals indicative of said image and comparing at least a part of said first signals with stored reference signals;
   controlling said feeding of the tape on the basis of said comparison;
wherein each of said first signals comprises signals indicative of portions of said image arranged spaced apart from one another in a direction that is transverse to said advancing direction.

10. A method according to claim 9, wherein said comparing operation comprises acquiring a series of single transverse image portions and putting said series of single transverse image portions in a relation to a series of stored reference single transverse image portions.

* * * * *